United States Patent
Horie et al.

(10) Patent No.: US 12,003,000 B2
(45) Date of Patent: Jun. 4, 2024

(54) LITHIUM ION BATTERY AND METHOD FOR ASSESSING DETERIORATION OF LITHIUM ION BATTERY

(71) Applicant: APB Corporation, Tokyo (JP)

(72) Inventors: Hideaki Horie, Tokyo (JP); Keiichiro Higashi, Kyoto (JP); Yohji Kawasaki, Kyoto (JP); Yusuke Mizuno, Kyoto (JP); Kotaro Nasu, Kyoto (JP)

(73) Assignee: APB CORPORATION, Tokyo (JP)

( * ) Notice: Subject to any disclaimer, the term of this patent is extended or adjusted under 35 U.S.C. 154(b) by 0 days.

(21) Appl. No.: 17/296,173

(22) PCT Filed: Mar. 19, 2020

(86) PCT No.: PCT/JP2020/012213
§ 371 (c)(1),
(2) Date: May 21, 2021

(87) PCT Pub. No.: WO2020/189750
PCT Pub. Date: Sep. 24, 2020

(65) Prior Publication Data
US 2022/0021089 A1     Jan. 20, 2022

(30) Foreign Application Priority Data

Mar. 20, 2019   (JP) .................................. 2019-053159
Sep. 6, 2019    (JP) .................................. 2019-163176

(51) Int. Cl.
*H01M 10/0525*    (2010.01)
*H01M 4/66*       (2006.01)
(Continued)

(52) U.S. Cl.
CPC ......... *H01M 50/528* (2021.01); *H01M 4/668* (2013.01); *H01M 10/0525* (2013.01);
(Continued)

(58) Field of Classification Search
CPC ............. H01M 50/184; H01M 50/204; H01M 50/284; H01M 50/528; H01M 50/569;
(Continued)

(56) References Cited

U.S. PATENT DOCUMENTS

2009/0023059 A1   1/2009   Kinoshita et al.
2009/0246607 A1*  10/2009  Shinyashiki ............ B32B 27/08
                                                              320/137
(Continued)

FOREIGN PATENT DOCUMENTS

CN       101552350 A    10/2009
JP       H10-106531 A    4/1998
(Continued)

OTHER PUBLICATIONS

Extended European Search Report, mailed Mar. 28, 2022 from EP App. No. 20774160.4.
(Continued)

*Primary Examiner* — Osei K Amponsah
(74) *Attorney, Agent, or Firm* — Workman Nydegger

(57) ABSTRACT

A lithium ion battery including a cell formed by sequentially stacking a positive current collector, a positive active material layer, a separator, a negative active material layer, and a negative current collector, the lithium ion battery being characterized by including a frame member disposed between the positive current collector and the negative current collector to seal the positive active material layer, the separator, and the negative active material layer, the frame member having, disposed therein, an electronic component for detecting an internal condition of the cell.

12 Claims, 9 Drawing Sheets

(51) Int. Cl.
  *H01M 10/0585* (2010.01)
  *H01M 10/48* (2006.01)
  *H01M 50/184* (2021.01)
  *H01M 50/204* (2021.01)
  *H01M 50/209* (2021.01)
  *H01M 50/284* (2021.01)
  *H01M 50/528* (2021.01)
  *H01M 50/569* (2021.01)

(52) U.S. Cl.
  CPC ....... *H01M 10/0585* (2013.01); *H01M 10/48* (2013.01); *H01M 10/486* (2013.01); *H01M 50/184* (2021.01); *H01M 50/204* (2021.01); *H01M 50/209* (2021.01); *H01M 50/284* (2021.01); *H01M 50/569* (2021.01)

(58) Field of Classification Search
  CPC ........ H01M 10/0525; H01M 10/0585; H01M 10/48; H01M 10/486; H01M 4/668
  See application file for complete search history.

(56) References Cited

U.S. PATENT DOCUMENTS

| | | | |
|---|---|---|---|
| 2013/0216867 A1 | 8/2013 | Schaefer et al. | |
| 2014/0152264 A1* | 6/2014 | Schaefer | H01M 10/02 429/178 |
| 2015/0037626 A1* | 2/2015 | Malcolm | H01M 10/613 429/53 |
| 2015/0056478 A1 | 2/2015 | Yamamoto | |
| 2016/0245875 A1 | 8/2016 | Kircheva et al. | |
| 2018/0260673 A1 | 9/2018 | Johnson et al. | |

FOREIGN PATENT DOCUMENTS

| | | | | |
|---|---|---|---|---|
| JP | 2007-242593 A | 9/2007 | | |
| JP | 2017147222 | 8/2017 | | |
| JP | 2017-224451 A | 12/2017 | | |
| JP | 2018-125213 A | 8/2018 | | |
| JP | 2019-207750 A | * 12/2019 | ........ H01M 10/0585 |
| JP | 2019207750 A | 12/2019 | | |

OTHER PUBLICATIONS

Chinese First Office Action, mailed Apr. 12, 2022, from CN App. No. 202080022669.4.

Decision of refusal on Feb. 20, 2023 in corresponding CN Patent Application No. 202080022669.4.

* cited by examiner

LITHIUM ION BATTERY AND METHOD FOR ASSESSING DETERIORATION OF LITHIUM ION BATTERY

TECHNICAL FIELD

The present invention relates to a lithium ion battery and a method for assessing deterioration of the lithium ion battery.

BACKGROUND ART

A lithium ion (secondary) battery is now used for various purposes as a high-capacity, small-sized, and lightweight secondary battery. As a lithium ion battery, PTL 1 discloses a lithium ion battery having a cell formed by sequentially stacking a positive current collector, a positive active material layer, a separator, a negative active material layer, and a negative current collector, the cell including an electrolyte solution.

CITATION LIST

Patent Literature

PTL 1: Japanese Patent Laid-Open No. 2018-125213

SUMMARY OF INVENTION

Technical Problem

During the process of using a lithium ion battery, there is a possibility that a malfunction locally occurs and the function of the battery rapidly deteriorates. In such a case, since it is not easy to check which part of the lithium ion battery malfunctions, the battery per se is often replaced without reusing the malfunctioning battery.

The present invention has been accomplished in order to solve the above problem and aims to provide a lithium ion battery capable of checking the internal condition of the lithium ion battery and having a configuration suitable for specifying a malfunctioning portion.

Solution to Problem

The present invention is a lithium ion battery comprising a cell formed by sequentially stacking a positive current collector, a positive active material layer, a separator, a negative active material layer, and a negative current collector, the lithium ion battery being characterized by comprising a frame member disposed between the positive current collector and the negative current collector to seal the positive active material layer, the separator, and the negative active material layer, the frame member having, disposed therein, an electronic component which detects an internal condition of the cell; a method for assessing deterioration of a lithium ion battery using the lithium ion battery stated above, the method being characterized in that the electronic component disposed in the frame member is a sensor for measuring potential transition during a recharge, and characterized by measuring, by the sensor, potential transition during a recharge and time required for the recharge, and in a case where a potential rise occurs in a shorter time than usual, assessing that a deterioration occurs at a position in the cell measured by that sensor; and a method for assessing deterioration of a lithium ion battery using the lithium ion battery stated above, the method being characterized in that the electronic component is disposed at each of multiple positions in the frame member provided around a perimeter of the cell, and the electronic component is a sensor which measures potential, and characterized by detecting a potential variation at different positions in the cell, and in a case where the potential variation exceeds a predetermined value, assessing that a deterioration occurs in the cell.

Advantageous Effects of Invention

According to the present invention, the internal condition of the cell can be detected by disposing the electronic component in the frame member of the cell, with the result that a malfunctioning portion of the lithium ion battery can be specified.

DESCRIPTION OF EMBODIMENTS

The present invention will be hereinafter described in detail. It should be noted that a lithium ion battery described herein is a concept including a lithium ion secondary battery.

A lithium ion battery of the present invention is a lithium ion battery comprising a cell formed by sequentially stacking a positive current collector, a positive active material layer, a separator, a negative active material layer, and a negative current collector, the lithium ion battery being characterized by comprising a frame member disposed between the positive current collector and the negative current collector to seal the positive active material layer, the separator, and the negative active material layer, the frame member having, disposed therein, an electronic component which detects an internal condition of the cell.

Figure 1:
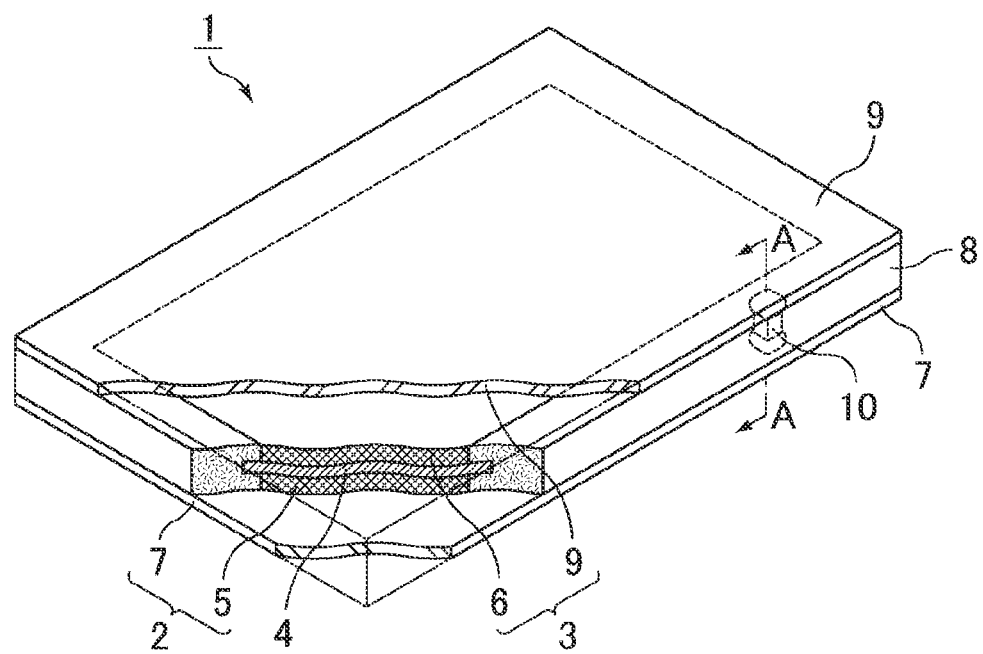
FIG. 1 is a partially cutaway perspective view schematically showing an example of a configuration of a lithium ion battery as a cell.

FIG. 1 is a partially cutaway perspective view schematically showing an example of a configuration of the lithium ion battery as a cell. In FIG. 1, a portion in which no electronic component is disposed in a frame member is cut away.

A cell 1 shown in FIG. 1, which is the lithium ion battery, is formed into a substantially-rectangular and planar shape as a whole by stacking a positive electrode 2, which is obtained by forming a positive active material layer 5 on the surface of a substantially-rectangular and planar positive current collector 7, and a negative electrode 3, which is obtained by forming a negative active material layer 6 on the surface of a similarly substantially-rectangular and planar negative current collector 9, via a similarly substantially-planar separator 4. The positive electrode and the negative electrode function as a positive electrode and a negative electrode of the lithium ion battery.

The cell 1 has a frame member 8 disposed between the positive current collector 7 and the negative current collector 9 to seal the positive active material layer 5, the separator 4, and the negative active material layer 6. In the cell 1 shown in FIG. 1, the frame member 8 is a ring-shaped frame member and fixes the edge portion of the separator 4 between the positive current collector 7 and the negative current collector 9. In FIG. 1, the cell is partially transparent to show a situation in which an electronic component 10 is disposed in the frame member 8.

The positive current collector 7 and the negative current collector 9 are positioned by the frame member 8 so as to be opposed at a predetermined interval. The separator 4, the positive active material layer 5, and the negative active material layer 6 are also positioned by the frame member 8 so as to be opposed at a predetermined interval.

An interval between the positive current collector 7 and the separator 4 and an interval between the negative current collector 9 and the separator 4 are adjusted according to the capacity of the lithium ion battery. The positional relationship among the positive current collector 7, the negative current collector 9, and the separator 4 is determined so as to obtain necessary intervals.

In the lithium ion battery of the present invention, an electronic component which detects the internal condition of the cell is disposed in the frame member. In a conventional lithium ion battery, no electronic component is disposed in the frame member and only the outside of the cell is considered as a place to dispose the electronic component. In contrast, in the lithium ion battery of the present invention, the internal condition of the cell can be detected by disposing the electronic component in the frame member. Since the electronic component is disposed in the frame member, space saving of the entire lithium ion battery can be facilitated without the need to provide space to dispose the electronic component outside the cell. Further, since a condition at a position close to the cell can be detected by disposing the electronic component in the cell, in a case where there is a defective portion in the cell, the accuracy of specifying a place where the defect has occurred is improved.

Figure 2:
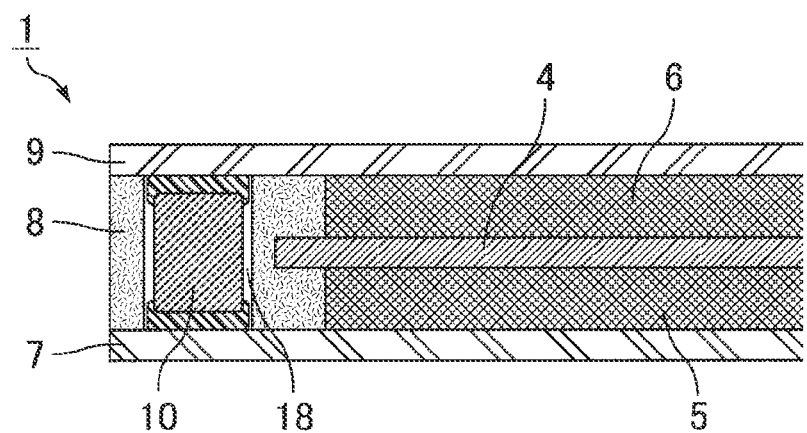
FIG. 2 is a cross-sectional view schematically showing a situation in which an electronic component is disposed in a frame member.

The electronic component disposed in the frame member will be hereinafter described. FIG. 2 is a cross-sectional view schematically showing a situation in which the electronic component is disposed in the frame member. FIG. 2 also corresponds to section A-A in FIG. 1.

FIG. 2 shows that the electronic component 10 is disposed in the frame member 8. Although the material for the frame member 8 is not particularly limited as long as it is a material having such durability as to withstand an electrolyte solution, the material is preferably a polymeric material and more preferably a thermosetting polymeric material. Specific examples thereof include epoxy-based resins, polyolefin-based resins, polyester-based resins, polyurethane-based resins, and polyvinylidene fluoride resins. The epoxy-based resins are preferable because they have high durability and are easy to handle.

The electronic component 10 is an electronic component for detecting the internal condition of the cell. For example, the electronic component is preferably a sensor which measures a temperature, voltage, current, or acoustic emission at a predetermined position in the cell. Further, the electronic component is preferably an electronic component capable of wireless output of a signal indicating the internal condition of the cell to the outside of the cell. If the electronic component is a sensor, the internal condition of the cell can be detected, and if the electronic component is an electronic component capable of wireless output, a signal indicating the detected condition can be wirelessly output and the measurement result can be received outside the battery, whereby the internal condition of the cell can be known without disassembling the cell.

Measuring the temperature, voltage, or current in the cell makes it possible to detect a local temperature rise, increase in current value, voltage drop, or the like caused by a malfunction such as a short at a portion of the cell. Further, measuring the acoustic emission makes it possible to detect whether a breakage or deformation occurs in the battery.

As the electronic component, a passive element or an active element can be used. As these elements, any element such as a capacitor, inductor, resistance, transistor, diode, IC, or LSI can be used. Further, in the case of an electronic component capable of wireless output, the electronic component may be a component such as an antenna, filter, amplifier, or oscillator, a wireless communication module obtained by modularizing these components, or a sensor-integrated module.

Further, a switch which switches between detection and non-detection of the internal condition of the cell by the electronic component disposed in the frame member may be comprised so as to turn the switch to detect the internal condition of the cell in a case where an external signal is provided. Detecting the internal condition of the cell only in a case where an external signal is provided enables a reduction in power consumption by the electronic component. Further, in the configuration described above, it is preferable that the electronic component comprise an antenna element for receiving an external signal. Examples of the external signal include a signal which commands detection of the internal condition of the cell and a signal which commands stopping of detection of the internal condition of the cell.

The electronic component is preferably electrically connected to the negative current collector and the positive current collector and configured to receive power supply from the lithium ion battery. If the electronic component is electrically connected to the negative current collector and the positive current collector, the electronic component can be activated by receiving power supply from the lithium ion battery. Since there is no need to provide a power source or wiring for activating the electronic component, the configuration can be simplified.

Further, in a case where the electronic component is electrically connected to the negative current collector and the positive current collector, it is preferable that the negative current collector and the positive current collector be resin current collectors and the negative current collector and the positive current collector be directly joined and electrically connected to the electronic component. In the case of using resin current collectors, the resin current collectors are brought into contact with electrodes of the electronic component and the resin current collectors are heated to soften the resin, whereby the resin current collectors can be directly joined to the electronic component. That is, the use of the resin current collectors enables electrical connection without interposing another bonding agent such as solder between the current collectors and the electronic component.

FIG. 2 shows that external electrodes of the electronic component 10 provided in the frame member 8 are in contact with the positive current collector 7 and the negative current collector 9. That is, the electronic component 10 is electrically connected to the positive current collector 7 and the negative current collector 9.

Further, it is preferable that the frame member be provided with a through hole for disposing the electronic component, the electronic component be disposed in the through hole, and the thickness of the frame member be substantially equal to the height of the electronic component. If the electronic component is disposed in the through hole, it is easy to dispose the electronic component in the frame member. By making the thickness of the frame member substantially equal to the height of the electronic component, the electronic component can be brought into contact with the positive current collector and the negative current collector and the electronic component can be electrically connected to the positive current collector and the negative current collector. FIG. 2 shows a state where the frame member 8 is provided with a through hole 18 and the electronic component 10 is disposed in the through hole 18. Further, the thickness of the frame member is substantially equal to the height of the electronic component.

Further, the electronic component disposed in the frame member may be a light-emitting element which outputs an optical signal. In the case of disposing a light-emitting element in the frame member, in order to direct light from the light-emitting element toward the outside of the cell, the light-emitting element is preferably embedded in the frame member in such a manner as to be exposed from the side surface of the frame member. In this manner, a signal indicating the internal condition of the cell can be wirelessly output to the outside of the cell in the form of an optical signal.

Figure 3:
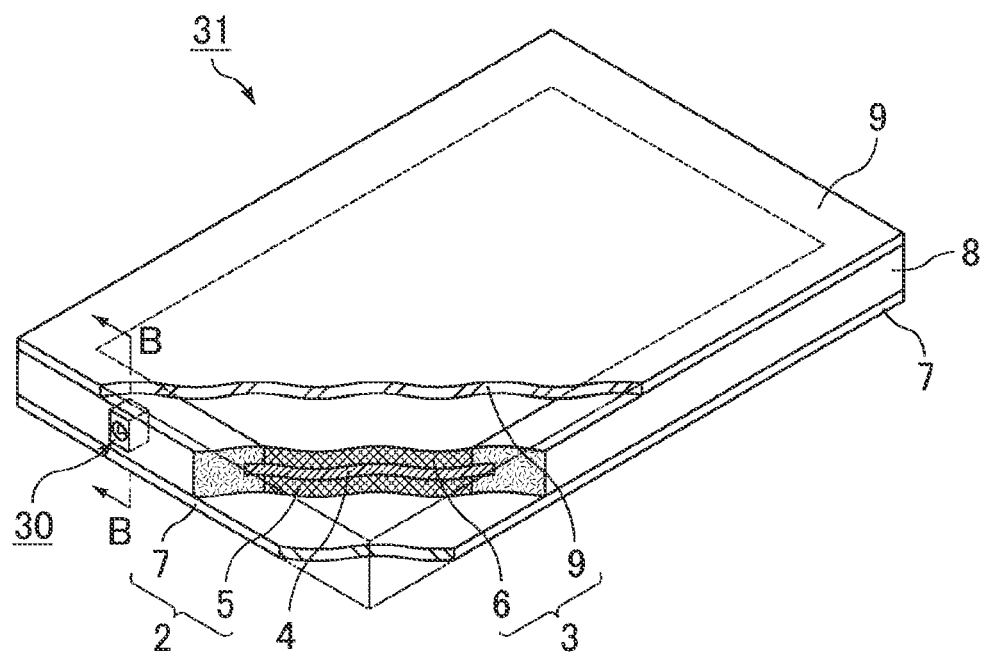
FIG. 3 is a partially cutaway perspective view schematically showing another example of the configuration of the lithium ion battery as the cell.
Figure 4:
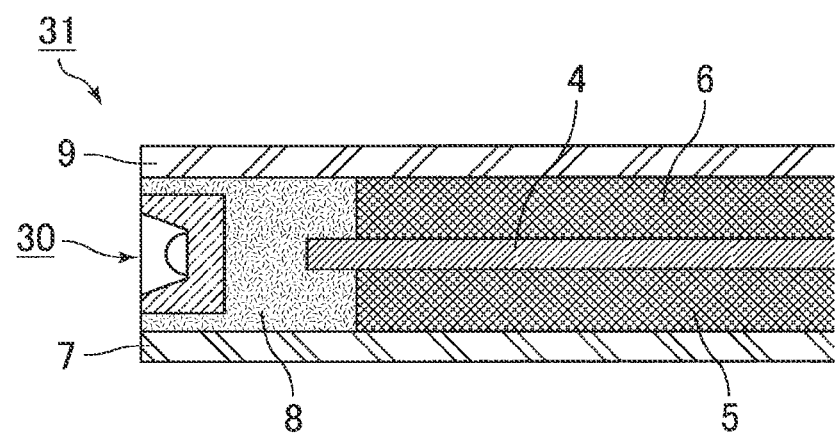
FIG. 4 is a cross-sectional view schematically showing a situation in which a light-emitting element is embedded and disposed in the frame member.

FIG. 3 is a partially cutaway perspective view schematically showing another example of the configuration of the lithium ion battery as the cell. FIG. 4 is a cross-sectional view schematically showing a situation in which the light-emitting element is embedded and disposed in the frame member. FIG. 4 also corresponds to section B-B in FIG. 3.

In a cell 31 shown in FIG. 3 and FIG. 4, a light-emitting element 30 is embedded in the frame member 8 in such a manner as to be exposed from the side surface of the frame member 8. The light-emitting element 30 converts an electrical signal obtained from the cell 31 into an optical signal. For example, by measuring a voltage between the positive current collector 7 and the negative current collector 9 in the cell 31 and emitting light in an optical signal pattern corresponding to the voltage, the voltage of the cell can be detected and wirelessly output to the outside of the cell in the form of an optical signal. For the purpose of measuring a voltage and causing the light-emitting element to emit light in an optical signal pattern corresponding to the voltage, a light-emitting substrate may be provided. In addition to the light-emitting element 30, the light-emitting substrate is preferably provided with a voltage measurement terminal which measures a voltage between the positive current collector and the negative current collector and a control element which performs control to cause the light-emitting element 30 to emit light in a predetermined optical signal pattern according to the voltage measured by the voltage measurement terminal.

The light-emitting substrate is preferably electrically connected to the negative current collector and the positive current collector such that the light-emitting element and the control element receive power supply from the cell.

Here, in the case of a short circuit in the control element of the light-emitting substrate, there is a possibility that a current continues flowing through the light-emitting element and the light-emitting element remains emitting light. The presence of a light-emitting element remaining emitting light causes a problem that signals from the other light-emitting elements cannot be discriminated at all. In consideration of such a case, an element (fuse) which shuts off a current may be provided for the purpose of suppressing transmission of an abnormal signal in the case of a failure such as a short circuit in the control element.

If the resistance of the fuse is high and the light-emitting voltage of the light-emitting element is also high, the light-emitting element cannot emit light even under normal conditions. Thus, the specification of each of the fuse and the light-emitting element is adjusted to cause the light-emitting element to emit light properly in a normal condition and to shut off a current to the light-emitting element and suppress transmission of an abnormal signal in an abnormal condition.

Examples of the optical signal pattern according to the voltage include a pattern in which light-emitting time per unit time becomes long and a pattern in which a pulse spacing becomes short to switch on/off light emission as a voltage measured by the voltage measurement terminal becomes high.

Further, the optical signal pattern is preferably designed to be decodable by software. More specifically, p defined by the following formula (1) is preferably equal to or greater than 1, more preferably equal to or greater than 1.5, and especially preferably equal to or greater than 1.75:

$$p=\log_{10}\{\text{period}/(\text{a pulse length from the start of transmission of the longest pulse to the end of the transmission} \times \text{the number of stacked cells})\} \quad (1)$$

Further, light emitted from the light-emitting element may have two or more colors. In this case, two or more types of light-emitting elements which emit different colors (emit light of different wavelengths) are used. In a case where light of two or more colors is emitted from the light-emitting elements, it is also necessary to provide two or more types of light-receiving elements corresponding to the number of colors of the light-emitting elements.

By emitting light of two or more colors from the light-emitting elements, a specific signal can be easily separated. The specific signal means a signal output in the case of an abnormality (abnormally high temperature, abnormally high voltage) in the battery. For example, if a color of light used in the case of outputting a normal signal for measuring the voltage of the cell is different from a color of light output in the case of an abnormality (abnormally high temperature, abnormally high voltage) in the battery, important information (information indicating the abnormal condition) can be correctly transmitted and received without signal interference.

Colors of light being two or more colors means wavelengths of two or more types of transmitted/received light being separated. For example, in a case where two colors of wavelength A and wavelength B are used for communication, it is only necessary to prevent a light-emitting element used to emit light of wavelength A (B) from outputting light of wavelength B (A) above a certain strength. More specifically, the separation of wavelengths of two or more types of light can be defined by the use of such an index that the strength at wavelength B of a light-emitting element used to emit light of wavelength A is 1/n of the strength at wavelength A. The value of n above can be determined as appropriate by the wavelengths of two or more types of light, the specifications of the light-emitting elements and light-receiving elements, and the like.

Although the example in which the voltage of the cell is measured and an optical signal pattern corresponding to the voltage is output has been described above, characteristics other than the voltage may be measured as the characteristics of the cell. For example, the temperature of the cell may be measured and an optical signal pattern corresponding to the temperature may be output.

The optical signal pattern output to the outside of the cell is received by a light-receiving element (not shown) provided outside the cell and insulated from the cell. The light-receiving element reversely converts the optical signal into the electrical signal, thereby obtaining an electrical signal indicating the internal condition of the cell (the same mechanism as a photocoupler). Examples of the light-emitting element include a light-emitting diode and examples of the light-receiving element include a phototransistor. Since the light-emitting element and the light-receiving element are in a wireless state and are electrically insulated, they are preferable from the viewpoint of safety. For example, on the occurrence of an abnormal voltage in either an internal or external circuit of the cell (such as a pulse high voltage caused by switching on/off), if the voltage is transferred to the other, there is a possibility that the pair of circuits are broken. An electrically-insulated state is preferable because such a breakage can be avoided.

Figure 5:
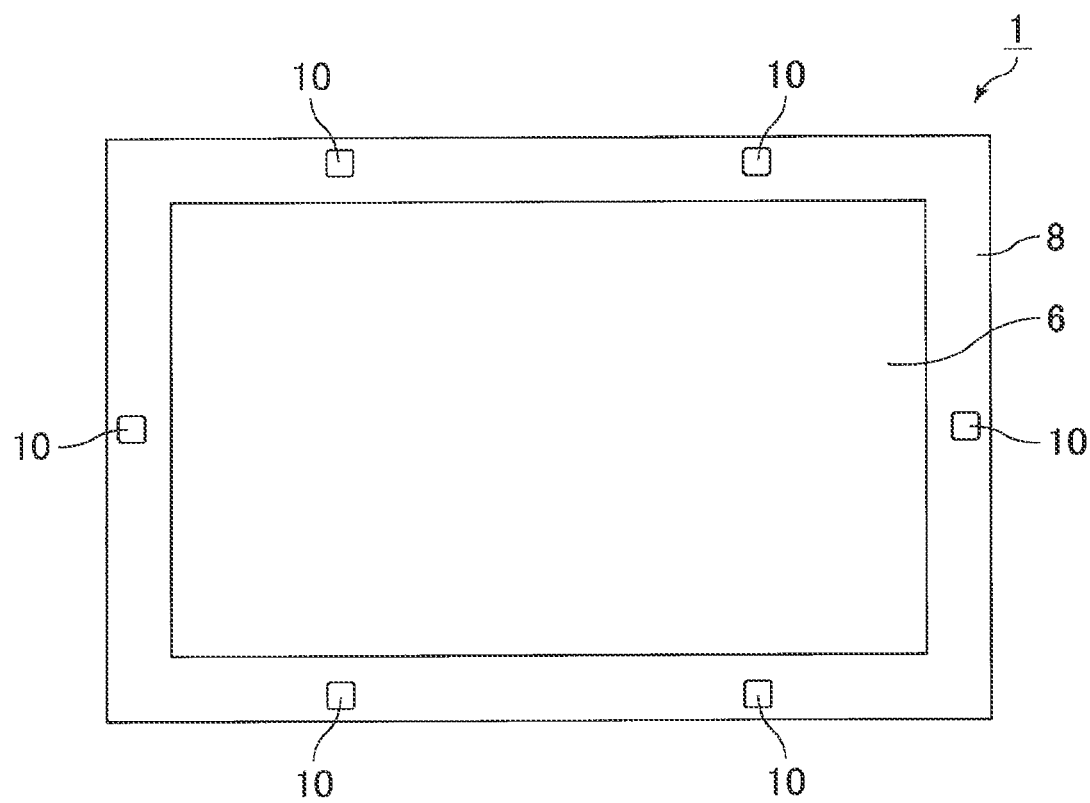
FIG. 5 is a top view schematically showing from the top a state in which a negative current collector is removed from the lithium ion battery shown in FIG. 1.

In the lithium ion battery of the present invention, the electronic component is preferably disposed at each of multiple positions in the frame member provided around the perimeter of the cell to detect individually the conditions at different portions in the cell. FIG. 5 is a top view schematically showing from the top a state in which the negative current collector is removed from the lithium ion battery shown in FIG. 1. FIG. 5 shows that the electronic components 10 are provided at six positions in the frame member 8. Each of the electronic components 10 provided at the six positions individually detects an index indicating the internal condition of the cell such that in a case where an abnormal value is seen only in an index obtained from a specific electronic component, it can be presumed that a defect has occurred near that electronic component. That is, the cause of occurrence of a defect in the cell can be easily specified. The number of electronic components to be provided in the frame member of the cell is not particularly limited and can be set as appropriate in consideration of the size of the cell, the size of the frame member, the size of the electronic components, and the like. Further, in the case of providing the electronic components at multiple positions in the frame member, the electronic components may be of the same type or a combination of different types of electronic components.

In the lithium ion battery of the present invention, the area of the cell seen from the top is defined as an area inside the frame member 8 in FIG. 5, that is, the area of the main surface of the negative active material layer and the positive active material layer. This area can be regarded as an effective area of the cell. As this area becomes large, a battery can be said to have a large battery capacity. Since the characteristics tend to be uneven in the cell as the area of the cell seen from the top becomes large, it is especially effective to dispose the electronic components at multiple positions in the frame member provided around the perimeter of the cell and cause them to detect individually the indexes indicating the internal conditions of the cell. For example, the area of the cell seen from the top is preferably equal to or greater than 600 cm$^2$. Further, as the relationship between the area of the cell seen from the top and the number of electronic components to be disposed, it is preferable to dispose one or two electronic components per 100 cm$^2$ of the area of the cell seen from the top.

In the lithium ion battery of the present invention, it is preferable that a wiring board be provided in the frame member and the electronic component be mounted on the wiring board. It is also preferable that the wiring board be provided with a different electronic component for controlling a current and/or voltage supplied to the electronic component. By providing the frame member with the wiring board and mounting the electronic component on the wiring board, a plurality of functions can be combined to perform various kinds of measurement and control. Further, a preferred current and/or voltage differs according to the specification of an electronic component. However, there is a case a current and/or voltage directly supplied from the lithium ion battery does not conform to the specification of an electronic component. In such a case, a different electronic component for controlling a current and/or voltage supplied to the electronic component is mounted and provided on the wiring board, whereby various electronic components can be used.

Figure 6:
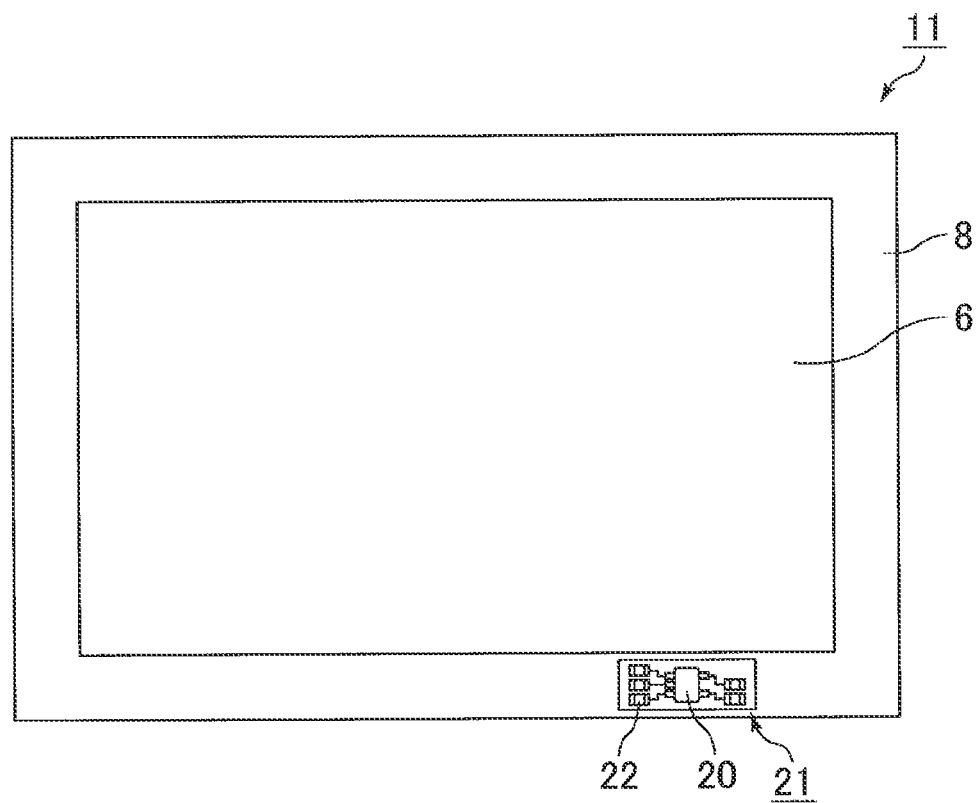
FIG. 6 is a top view schematically showing from the top a state in which a negative current collector is removed from a lithium ion battery having a frame member provided with a wiring board.

FIG. 6 is a top view schematically showing from the top a state in which the negative current collector is removed from the lithium ion battery having the frame member provided with the wiring board. In a cell 11 shown in FIG. 6, the frame member 8 is provided with a wiring board 21 and an electronic component 20 is mounted on the wiring board 21. FIG. 6 shows an electronic component assumed to be an amplifier or IC as the electronic component 20 and an electronic component assumed to be a chip resistor as a different electronic component 22 for controlling a current and/or voltage. The types of electronic components actually mounted on the wiring board 21 are not limited to those. Further, the case of providing a frame member with a module obtained by combining a plurality of electronic components is also included in one aspect of the case of providing a frame member with a wiring board if the module includes a wiring board.

A preferred aspect of each constituent element of the cell will be hereinafter described. The positive active material layer includes a positive active material. Examples of the positive active material include multiple oxides of lithium and transition metal (multiple oxides with a single transition metal [LiCoO$_2$, LiNiO$_2$, LiAlMnO$_4$, LiMnO$_2$, LiMn$_2$O$_4$, etc.], multiple oxides with two transition metal elements [e.g., LiFeMnO$_4$, LiNi$_{1-x}$Co$_x$O$_2$, LiMn$_{1-y}$Co$_y$O$_2$, LiNi$_{1/3}$Co$_{1/3}$Al$_{1/3}$O$_2$, and LiNi$_{0.8}$Co$_{0.15}$Al$_{0.05}$O$_2$], multiple oxides with three or more metal elements [e.g., LiM$_a$M'$_b$M"$_c$O$_2$ (where M, M', and M" are different transition metal elements and satisfy a+b+c=1; e.g., LiNi$_{1/3}$Mn$_{1/3}$Co$_{1/3}$O$_2$)], etc.), lithium-containing transition metal phosphates (e.g., LiFePO$_4$, LiCoPO$_4$, LiMnPO$_4$, and LiNiPO$_4$), transition metal oxides (e.g., MnO$_2$ and V$_2$O$_5$), transition metal sulfides (e.g., MoS$_2$ and TiS$_2$), and conductive polymers (e.g., polyaniline, polypyrrole, polythiophene, polyacetylene, poly-p-phenylene, and polyvinylcarbazole), where two or more types of them may be used together. Some of the transition metal sites of the lithium-containing transition metal phosphates may be substituted by another transition metal.

The positive active material is preferably a coated positive active material coated with a conductive agent and a coating resin. If the exterior of the positive active material is coated with a coating resin, a change in volume of an electrode is reduced and the expansion of the electrode can be suppressed.

Examples of the conductive agent include metal-based conductive agents (aluminum, stainless steel [SUS], silver, gold, copper, titanium, etc.), carbon-based conductive agents (graphite and carbon black [acetylene black, ketjen black, furnace black, channel black, thermal lamp black, etc.] etc.), and mixtures thereof. Among these conductive agent, a single kind may be used alone and two or more kinds may be used together. Further, they may be used as their alloys or metal oxides. In particular, from the viewpoint of electrical stability, aluminum, stainless steel, silver, gold, copper, titanium, carbon-based conductive agents and mixtures thereof are more preferable, silver, gold, aluminum, stainless steel and carbon-based conductive agents are yet more preferable, and carbon-based conductive agents are especially preferable. These conductive agents may be ones obtained by coating the periphery of a particulate ceramic material or resin material with a conductive material (preferably metal-based ones among the conductive agents listed above) by means of plating or the like.

The shape (form) of the conductive agent is not limited to a particulate form and may be a form other than the particulate form such as a form actually used as a so-called filler conductive agent such as a carbon nanofiber or carbon nanotube.

The ratio between the coating resin and the conductive agent is not particularly limited. However, from the viewpoint of the internal resistance of the battery and the like, the weight ratio between the coating resin (weight of resin solids) and the conductive agent is preferably from 1:0.01 to 1:50, and more preferably from 1:0.2 to 1:3.0.

As the coating resin, ones disclosed as nonaqueous secondary battery active material coating resins in Japanese Patent Laid-Open No. 2017-054703 can be suitably used.

Further, the positive active material layer may include a conductive agent other than the conductive agent included in the coated positive active material. As the conductive agent, the same ones as those included in the coated positive active material described above can be suitably used.

It is preferable that the positive active material layer include positive active materials and be an unbound body not including a binding agent which binds the positive active materials together. The unbound body used here means that positive active materials are not bound to each other, where binding means that positive active materials are irreversibly fixed to each other.

The positive active material layer may include an adhesive resin. As the adhesive resin, for example, one obtained by mixing a small amount of organic solvent with a non-aqueous secondary battery active material coating resin disclosed in Japanese Patent Laid-Open No. 2017-054703 and adjusting its glass transition temperature below the room temperature and one disclosed as an adhesive in Japanese Patent Laid-Open No. H10-255805 (1998) can be suitably used. The adhesive resin means a resin which does not solidify and has adhesion (the property of adhering by applying a slight pressure without the use of water, solvent, or heat) even if solvent components are volatilized and dried. In contrast, an electrode binder of a solvent drying type used as the binding agent indicates one drying and solidifying by volatilizing solvent components to strongly bond and fix active materials. Accordingly, an electrode binder (binding agent) of a solvent drying type is a material different from the adhesive resin.

The thickness of the positive active material layer is not particularly limited. However, from the viewpoint of battery performance, the thickness is preferably from 150 to 600 µm and more preferably from 200 to 450 µm.

The negative active material layer includes a negative active material. As the negative active material, a well-known negative active material for a lithium ion battery can be used and examples thereof include carbon-based materials (graphite, non-graphitizable carbon, amorphous carbon, resin calcined material [e.g., calcined and carbonized phenolic resin and furan resin], cokes [e.g., pitch coke, needle coke, and petroleum coke], carbon fibers, etc.), silicon-based materials (silicon, silicon oxide [SiOx], silicon-carbon composites [carbon particles with surfaces coated with silicon and/or silicon carbide, silicon particles or silicon oxide particles with surfaces coated with carbon and/or silicon carbide, silicon carbide, etc.], silicon alloys [silicon-aluminum alloy, silicon-lithium alloy, silicon-nickel alloy, silicon-iron alloy, silicon-titanium alloy, silicon-manganese alloy, silicon-copper alloy, silicon-tin alloy, etc.] etc.), conductive polymers (e.g., polyacetylene and polypyrrole), metals (tin, aluminum, zirconium, titanium, etc.), metal oxides (titanium oxide, lithium-titanium oxide, etc.), metal alloys (e.g., lithium-tin alloy, lithium-aluminum alloy, and lithium-aluminum-manganese alloy), and mixtures of them and carbon-based materials.

Further, the negative active material may be a coated negative active material coated with a conductive agent and a coating resin like the coated positive active material described above. As the conductive agent and the coating resin, the same conductive agent and coating resin as those used for the coated positive active material described above can be suitably used.

Further, the negative active material layer may include a conductive agent other than the conductive agent included in the coated negative active material. As the conductive agent, the same conductive agent as that included in the coated positive active material described above can be suitably used.

The negative active material layer is preferably an unbound body not including a binding agent which binds negative active materials together like the positive active material layer. Further, the negative active material layer may include an adhesive resin like the positive active material layer.

The thickness of the negative active material layer is not particularly limited. However, from the viewpoint of battery performance, the thickness is preferably from 150 to 600 µm and more preferably from 200 to 450 µm.

Examples of the material for the positive current collector and the negative current collector (hereinafter collectively referred to as current collectors) include metal materials such as copper, aluminum, titanium, stainless steel, nickel, and alloys thereof, calcined carbon, conductive polymeric material, and conductive glass. Among these materials, from the viewpoint of weight reduction, corrosion resistance, and high conductivity, it is preferable to use aluminum as the positive current collector and copper as the negative current collector.

Further, the current collectors are preferably resin current collectors made of a conductive polymeric material. The shape of the current collector is not particularly limited and may be a sheet-like current collector made of the material stated above or a deposited layer made from fine particles of the material stated above. The thickness of the current collector is not particularly limited but is preferably from 50 to 500 µm.

As the conductive polymeric material for the resin current collector, for example, a conductive polymeric material or resin to which a conductive agent is added as necessary can be used. As the conductive agent for the conductive polymeric material, the same conductive agent as that included in the coated positive active material described above can be suitably used.

Examples of the resin forming the conductive polymeric material include polyethylene (PE), polypropylene (PP), polymethylpentene (PMP), polycycloolefin (PCO), polyethylene terephthalate (PET), polyether nitrile (PEN), polytetrafluoroethylene (PTFE), styrene-butadiene rubber (SBR), polyacrylonitrile (PAN), polymethylacrylate (PMA), polymethylmethacrylate (PMMA), polyvinylidene fluoride (PVdF), epoxy resin, silicone resin, and a mixture thereof. From the viewpoint of electrical stability, polyethylene (PE), polypropylene (PP), polymethylpentene (PMP), and polycycloolefin (PCO) are preferable, and polyethylene (PE), polypropylene (PP), and polymethylpentene (PMP) are more preferable.

Examples of the separator include a well-known separator for a lithium ion battery such as a porous film made of polyethylene or polypropylene, a laminated film of a porous polyethylene film and a porous polypropylene film, a non-woven fabric made of synthetic fibers (polyester fibers, aramid fibers, etc.), glass fibers, etc., and those having a surface with fine ceramic particles of silica, alumina, titania, etc. adhering thereto.

The positive active material layer and the negative active material layer include an electrolyte solution. As the electrolyte solution, a well-known electrolyte solution for use in manufacture of a well-known lithium ion battery containing an electrolyte and a nonaqueous solvent can be used.

As the electrolyte, one used for a well-known electrolyte solution or the like can be used and examples thereof include inorganic acid lithium salts such as $LiN(FSO_2)_2$, $LiPF_6$, $LiBF_4$, $LiSbF_6$, $LiAsF_6$, and $LiClO_4$ and organic acid lithium salts such as $LiN(CF_3SO_2)_2$, $LiN(C_2F_5SO_2)_2$, and $LiC(CF_3SO_2)_3$. Among them, from the viewpoint of battery output and charge/discharge cycle characteristics, it is preferable to use imide-based electrolytes ($LiN(FSO_2)_2$, $LiN(CF_3SO_2)_2$, $LiN(C_2F_5SO_2)_2$, etc.) and $LiPF_6$.

As the nonaqueous solvent, one used for a well-known electrolyte solution or the like can be used. For example, a lactone compound, cyclic or chain carbonate ester, chain carboxylic acid ester, cyclic or chain ether, phosphoric ester, nitrile compound, amide compound, sulfone, sulfolane, and mixtures thereof can be used.

The electrolyte concentration of the electrolyte solution is preferably from 1 to 5 mol/L, more preferably from 1.5 to 4 mol/L, and yet more preferably from 2 to 3 mol/L. If the electrolyte concentration of the electrolyte solution is less than 1 mol/L, sufficient input/output characteristics of the battery cannot be obtained in some cases. If the electrolyte concentration of the electrolyte solution exceeds 5 mol/L, the electrolyte is often precipitated. The electrolyte concentration of the electrolyte solution can be checked by extracting an electrolyte solution forming an electrode for a lithium ion battery or a lithium ion battery without using a solvent or the like and measuring its concentration.

The lithium ion battery of the present invention may be a stacked battery formed by stacking a plurality of cells, wherein the electronic components disposed in the frame members individually detect the conditions of the respective cells forming the stacked battery.

Figure 7:
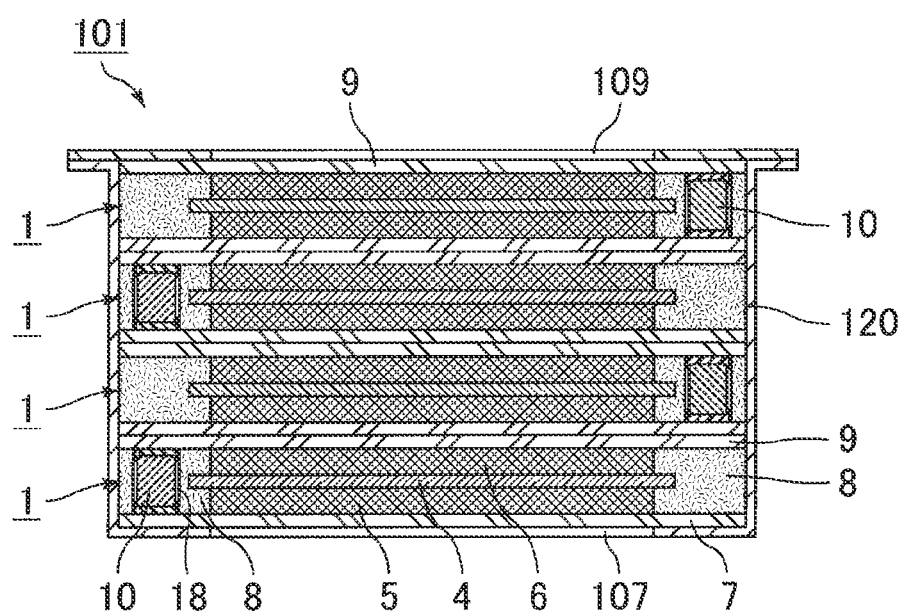
FIG. 7 is a cross-sectional view schematically showing an example of a stacked battery.

FIG. 7 is a cross-sectional view schematically showing an example of the stacked battery. FIG. 7 shows a stacked battery 101 formed by stacking four cells 1 shown in FIG. 1. In the stacked battery 101, cells 1 are stacked in series such that the top surface of the negative current collector 9 and the bottom surface of the positive current collector 7 of adjacent cells are adjacent to each other. The stacked battery 101 is accommodated in a container 120.

The bottom surface of the container 120 is provided with a positive extraction portion 107 and the top surface of the container 120 is provided with a negative extraction portion 109. The positive extraction portion 107 is electrically connected to the positive current collector 7 of the lowermost cell 1 and the negative extraction portion 109 is electrically connected to the negative current collector 9 of the uppermost cell 1.

The electronic components 10 are disposed in the frame members 8 of the cells 1, respectively. FIG. 7 shows a cross-sectional view in which the electronic components 10 are alternately disposed on the right and left sides. However, the position where the electronic component is disposed in each cell may be the same as or different from the positions of the other cells forming the stacked battery.

Since the electronic component is disposed in the frame member of each cell, the internal condition of each cell can be individually detected. Thus, on the occurrence of a defect in the use of the stacked battery, which cell is malfunctioning can be specified. Replacing only a malfunctioning cell enables the reuse of the stacked battery in which the defect has occurred while making full use of the most part of the stacked battery.

Also in the stacked battery, the electronic component disposed in the frame member of the cell may be a light-emitting element which outputs an optical signal. An example of the case where the electronic component disposed in the frame member of the cell is a light-emitting element is as has been described with reference to FIG. 3 and FIG. 4.

In a case where a light-emitting element is disposed in the frame member of each of the cells forming the stacked battery, the side surface of the stacked battery is preferably provided with an optical waveguide into which optical signals from the light-emitting elements are introduced. Further, a container may be provided to accommodate the stacked battery and the optical waveguide and one end of the optical waveguide may be drawn out of the container such that a light-receiving unit receives optical signals derived from the one end of the optical waveguide drawn out of the container.

Figure 8:
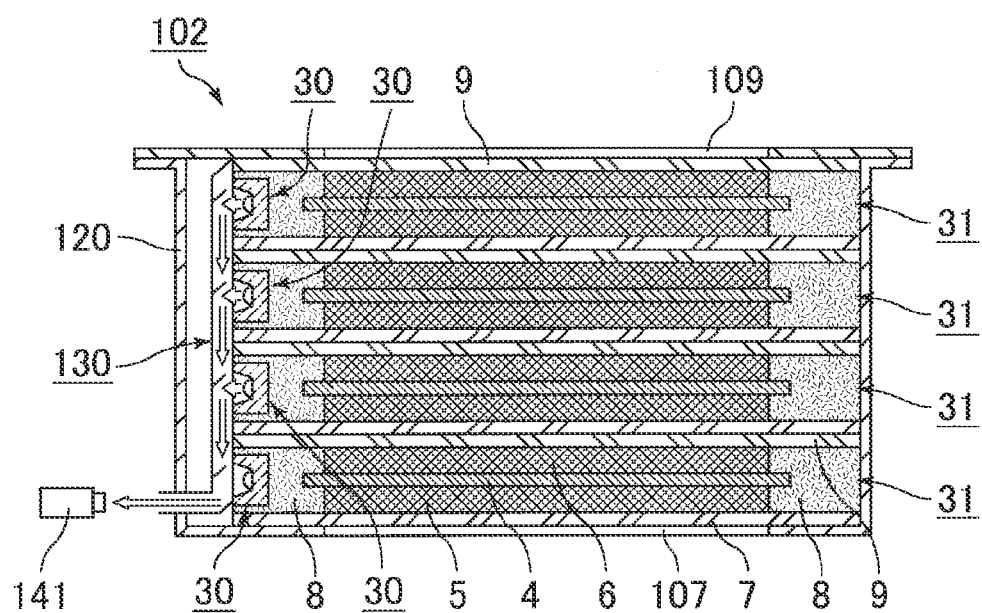
FIG. 8 is a cross-sectional view schematically showing an example of a situation in which a light-emitting element is embedded and disposed in a frame member of a cell forming the stacked battery.

FIG. 8 is a cross-sectional view schematically showing an example of a situation in which the light-emitting element is embedded and disposed in the frame member of the cell forming the stacked battery. In the cell 31 forming a stacked battery 102 shown in FIG. 8, a light-emitting element 30 is embedded in the frame member 8 in such a manner as to be exposed from the side surface of the frame member 8. The side surface of the stacked battery 102 is provided with an optical waveguide 130 into which optical signals are introduced from the light-emitting elements 30. An optical signal is introduced from the light-emitting element 30 of each cell 31 into the optical waveguide 130. The stacked battery 102 and the optical waveguide 130 are accommodated in the container 120. However, one end of the optical waveguide 130 is drawn out of the container 120 such that optical signals derived from the one end are received by a light-receiving element 141.

The light-receiving element 141 can reversely convert the optical signals into electrical signals to obtain electrical signals indicating the internal conditions of the cells included in the stacked battery.

Figure 9:
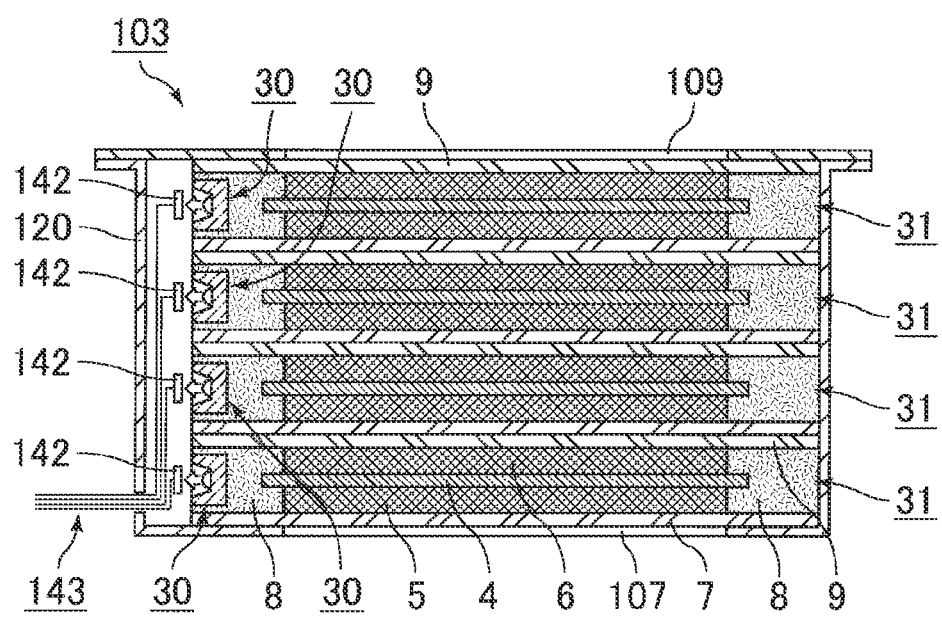
FIG. 9 is a cross-sectional view schematically showing another example of the situation in which the light-emitting element is embedded and disposed in the frame member of the cell forming the stacked battery.

FIG. 9 is a cross-sectional view schematically showing another example of the situation in which the light-emitting element is embedded and disposed in the frame member of the cell forming the stacked battery. Also in the cell 31 forming the stacked battery 103 shown in FIG. 9, the light-emitting element 30 is embedded in the frame member 8 in such a manner as to be exposed from the side surface of the frame member 8. The side surface of the stacked battery 103 is provided with a light-receiving element 142 for each light-emitting element 30. Each light-receiving element 142 reversely converts a signal into an electrical signal to obtain an electrical signal indicating the internal condition of the cell included in the stacked battery. The stacked battery 103 and the light-receiving element 142 are accommodated in the container 120. However, one end of wiring 143 connected to the light-receiving elements 142 is drawn out of the container 120 such that electrical signals are output to the outside of the container 120 via the wiring 143.

Also in the case of the stacked batteries described with reference to FIG. 8 and FIG. 9, if the electronic components disposed in the frame members of the cells are light-emitting elements which output optical signals, the light-emitting elements and the light-receiving element(s) are in a wireless state. Since the light-emitting elements and the light-receiving element(s) are electrically insulated, they are preferable from the viewpoint of safety.

The lithium ion battery of the present invention may be a battery module formed by combining a plurality of stacked batteries, each of which is formed by stacking a plurality of cells, wherein the condition of each stacked battery forming the battery module is individually detected by the electronic component disposed in the frame member.

Even in a case where the lithium ion battery is a battery module formed by combining a plurality of stacked batteries, since the electronic components are disposed in the frame members of the cells, the internal condition of each cell can be individually detected. Thus, on the occurrence of a defect in the use of the battery module, which cell in which stacked battery is malfunctioning can be specified. Further, replacing only a malfunctioning cell enables the reuse of the battery module in which the defect has occurred while making full use of the most part of the battery module.

Signals transmitted ahead of the light-receiving element 141 in the stacked battery 102 shown in FIG. 8 and ahead of the wiring 143 in the stacked battery 103 shown in FIG. 9 are processed by a hardware device outside the stacked battery. The hardware device functions as a part of a battery management system (BMS) and the hardware device and the stacked battery can be separated. In general, the lifetime of the hardware device is set at about 10 years, whereas the stacked battery can be used for a longer period depending on its usage. Accordingly, if the stacked battery and the hardware device can be separated, only the hardware device can be replaced and the stacked battery can be continuously used without disassembling the stacked battery after the expiration of the lifetime of the hardware device. In this manner, the extension of the life of the entire battery management system can be facilitated.

Next, a description will be given of a method for assessing deterioration of the lithium ion battery of the present invention, which is an example of the usage of the lithium ion battery of the present invention. In the method for assessing deterioration of the lithium ion battery of the present invention using the lithium ion battery of the present invention, the electronic component disposed in the frame member is a sensor for measuring potential transition during a recharge such that potential transition during a recharge and time required for the recharge are monitored by the sensor, and in a case where a potential rise occurs in a shorter time than usual, it is assessed that a deterioration occurs at a position in the cell measured by that sensor.

If the electronic component disposed in the frame member in the lithium ion battery of the present invention is a sensor for measuring potential transition during a recharge, potential transition during a recharge and time required for the recharge at a predetermined position of the cell can be monitored. Since a current is kept constant during a recharge, a high speed of potential rise means a reduction in capacity of the cell, that is, the deterioration of the cell.

In particular, in a case where the lithium ion battery of the present invention is a stacked battery, the electronic component disposed in the frame member can monitor the potential transition during a recharge for each cell such that in a case where a cell having a high speed of potential rise is specified, it can be specified that the cell is especially deteriorated. Further, also in a case where the lithium ion battery of the present invention is a battery module, the electronic component disposed in the frame member monitors the potential transition during a recharge for each cell or each stacked battery such that in a case where a cell or stacked battery having a high speed of potential rise is specified, it can be specified that the cell or stacked battery is especially deteriorated.

For example, on the assumption that the time when a potential rise occurs in a normal condition is defined as 100%, a cell can be determined to be deteriorated in a case where the time when a potential rise occurs is 70% or less.

Next, a description will be given of a method for assessing deterioration of the lithium ion battery of the present invention, which is another example of the usage of the lithium ion battery of the present invention. In the method for assessing deterioration of the lithium ion battery of the present invention using the lithium ion battery of the present invention, the electronic components are disposed at multiple positions in the frame member provided around the perimeter of the cell, the electronic components are sensors which measure potential, a potential variation in different positions in the cell is detected, and if the potential variation exceeds a predetermined value, it is assessed that a deterioration occurs in the cell.

In the lithium ion battery of the present invention, if the electronic components are disposed at multiple positions in the frame member provided around the perimeter of the cell and the electronic components are sensors which measure potential, a potential variation at different positions in the cell can be detected. In a battery which is not deteriorated, the potential measured in one cell is constant at every position in the cell. In contrast, in a case where there is a variation in potential detected from each sensor in the cell, a deterioration is considered to occur in the cell. Thus, sensors which measure potential are provided at multiple positions in the frame member of one cell and are caused to detect the potential in the cell individually, thereby specifying a deteriorated cell.

For example, as to a variation in potential measured at multiple positions in one cell, a cell is determined to be deteriorated in a case where there arises a measurement point ±0.2V or more away from the average value of voltage measurement values.

Further, in a case where the lithium ion battery of the present invention is a stacked battery, the electronic component disposed in the frame member monitors the potential for each cell and detects a variation in potential for each cell, and in a case where there is a variation in potential between cells, it can be specified that a cell different in potential from the other cells is especially deteriorated. Further, also in a case where the lithium ion battery of the present invention is a battery module, an electronic component disposed in the frame member monitors the potential transition during a recharge for each cell or each stacked battery, and in a case where there is a variation in potential between cells or stacked batteries, it can be specified that a cell or stacked battery different in potential from the other cells or stacked batteries is especially deteriorated.

It should be noted that the configuration of disposing the electronic component in the frame member in the present invention is not limited to the above-described configuration of embedding and disposing the electronic component in the frame member. For example, the configuration may be a configuration of accommodating the electronic component in a notch portion (recessed portion) formed on the peripheral surface of the frame member. The configuration can be modified into various other configurations as long as the electronic component is disposed in an area in which the frame member is disposed (an area of an edge portion between the positive current collector and the negative current collector).

INDUSTRIAL APPLICABILITY

The lithium ion battery of the present invention can detect the internal condition of the cell by disposing the electronic component in the frame member of the cell, with the result that a malfunctioning portion of the lithium ion battery can be specified. Further, in the case of using the lithium ion battery of the present invention for a stacked battery or a battery module, replacing only a malfunctioning cell enables the reuse of a stacked battery or battery module in which the defect has occurred while making full use of the most part of the stacked battery or battery module.

REFERENCE SIGNS LIST 1, 11, 31 cell
2 positive electrode
3 negative electrode
4 separator
5 positive active material layer
6 negative active material layer
7 positive current collector
8 frame member
9 negative current collector
10, 20 electronic component
18 through hole
21 wiring board
22 different electronic component
30 light-emitting element
101, 102, 103 stacked battery
107 positive extraction portion
109 negative extraction portion
120 container
130 optical waveguide
141, 142 light-receiving element
143 wiring

The invention claimed is:

1. A lithium ion battery comprising a cell formed by sequentially stacking a positive current collector, a positive active material layer, a separator, a negative active material layer, and a negative current collector,
   the lithium ion battery comprising a frame member disposed between the positive current collector and the negative current collector to seal the positive active material layer, the separator, and the negative active material layer,
   the frame member having, disposed therein, an electronic component which detects an internal condition of the cell.

2. The lithium ion battery according to claim 1, wherein the electronic component is a sensor which measures a temperature, voltage, current, or acoustic emission at a predetermined position in the cell.

3. The lithium ion battery according to claim 1, wherein the electronic component is disposed at each of multiple positions in the frame member provided around a perimeter of the cell to individually detect conditions at different positions in the cell.

4. The lithium ion battery according to claim 1, wherein the electronic component is electrically connected to the negative current collector and the positive current collector and receives power supply from the lithium ion battery.

5. The lithium ion battery according to claim 4, wherein the negative current collector and the positive current collector are resin current collectors and the negative current collector and the positive current collector are directly joined and electrically connected to the electronic component.

6. The lithium ion battery according to claim 1, wherein the frame member is provided with a through hole for disposing the electronic component, the electronic component is disposed in the through hole, and a thickness of the frame member is substantially equal to a height of the electronic component.

7. The lithium ion battery according to claim 1, wherein a wiring board is provided in the frame member and the electronic component is mounted on the wiring board.

8. The lithium ion battery according to claim 7, wherein the wiring board has, mounted thereon, a different electronic component for controlling a current and/or voltage supplied to the electronic component.

9. The lithium ion battery according to claim 1, wherein the electronic component wirelessly outputs a signal indicating the internal condition of the cell to an outside of the cell.

10. The lithium ion battery according to claim 1, wherein the lithium ion battery is a stacked battery formed by stacking a plurality of the cells, and
    the electronic component disposed in the frame member individually detects a condition of each of the cells forming the stacked battery.

11. The lithium ion battery according to claim 1, wherein the lithium ion battery is a battery module formed by combining a plurality of stacked batteries, each of the stacked batteries being formed by stacking a plurality of the cells, and the electronic component disposed in the frame member individually detects a condition of each of the stacked batteries forming the battery module.

12. The lithium ion battery according to claim 1, comprising a switch which switches between detection and non-detection of the internal condition of the cell by the electronic component disposed in the frame member,
wherein in a case where an external signal is provided, the switch is turned to detect the internal condition of the cell.

\* \* \* \* \*